United States Patent
Liaw

(10) Patent No.: US 8,797,787 B2
(45) Date of Patent: Aug. 5, 2014

(54) SEMICONDUCTOR MANUFACTURING METHOD

(75) Inventor: Jhon Jhy Liaw, Zhudong Township (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 316 days.

(21) Appl. No.: 13/293,163

(22) Filed: Nov. 10, 2011

(65) Prior Publication Data
US 2013/0121087 A1 May 16, 2013

(51) Int. Cl.
*G11C 11/00* (2006.01)

(52) U.S. Cl.
USPC 365/154; 365/156; 365/189.05; 365/189.011; 257/202; 257/204; 257/903

(58) Field of Classification Search
USPC .............. 365/154, 156, 189.05, 189.011; 257/202, 204, 903
See application file for complete search history.

(56) References Cited

U.S. PATENT DOCUMENTS

| | | | |
|---|---|---|---|
| 7,233,032 B2 | 6/2007 | Liaw | |
| 8,077,530 B2* | 12/2011 | Ishikura et al. | 365/189.15 |
| 2007/0279966 A1* | 12/2007 | Houston | 365/154 |
| 2009/0316500 A1* | 12/2009 | Mikan et al. | 365/189.14 |
| 2010/0259973 A1* | 10/2010 | Houston | 365/154 |

OTHER PUBLICATIONS

Chang, L. et al., "Stable SRAM Cell Design for the 32 nm Node and Beyond", 2005 Symposium on VLSI Technology Digest of Technical Papers, pp. 128-129.

Drennan, P.G. et al., "Implications of Proximity Effects for Analog Design", IEEE Custom Integrated Circuits Conference, Sep. 2006, pp. 169-176.

* cited by examiner

*Primary Examiner* — Toan Le
(74) *Attorney, Agent, or Firm* — Duane Morris LLP

(57) ABSTRACT

A memory bit cell includes a latch, a write port coupled to the latch, and a read port coupled to the latch. The write port includes a first set of devices having a first threshold voltage and a second set of devices having a second threshold voltage that is greater than the first threshold voltage. The read port includes a third set of devices having a third threshold voltage that is less than the first threshold voltage.

17 Claims, 5 Drawing Sheets

SEMICONDUCTOR MANUFACTURING METHOD

FIELD OF DISCLOSURE

The methods relate to semiconductor memories. More specifically, the disclosed methods relate to manufacturing methods for semiconductor memories.

BACKGROUND

Static random access memories ("SRAM") include a plurality of cells disposed in rows and columns to form an array. Conventional SRAM cells include a plurality of transistors coupled to bit lines and word lines that are used to read and write a bit of data to the memory cell. As the size of SRAM cells continues to decrease, the supply voltage VCC is typically lowered to reduce the power consumption of the devices. Lowering the supply voltage reduces the amount of read current, which results in the leakage current being larger relative to the read current. This increase in the leakage current compared to the read current results in difficulty in accurately reading data from the memory cell as well as reducing the speed at which data may be read from or written to the bit cell.

DETAILED DESCRIPTION

This description of the exemplary embodiments is intended to be read in connection with the accompanying drawings, which are to be considered part of the entire written description.

The improved semiconductor memories described herein advantageously provide higher operating speeds with lower leakage. The advantages provided by the improved semiconductor memories disclosed herein are provided without requiring additional footprint on the semiconductor substrate.

In some embodiments, a memory bit cell includes a latch, a write port coupled to the latch, and a read port coupled to the latch. The write port includes a first set of devices having a first threshold voltage and a second set of devices having a second threshold voltage that is greater than the first threshold voltage. The read port includes a third set of devices having a third threshold voltage that is less than the first threshold voltage.

In some embodiments, a method of fabricating a semiconductor memory includes forming a first set of devices of a memory bit cell having a first threshold voltage in a semiconductor substrate. A second set of devices of the memory bit cell are formed in the semiconductor substrate and have a second threshold voltage that is greater than the first threshold voltage. A third set of devices of the memory bit cell are formed in the semiconductor substrate and have a third threshold voltage that is less than the first threshold voltage. A fourth set of devices of the memory bit cell are formed in the semiconductor substrate and have a fourth threshold voltage.

In some embodiments, a semiconductor memory includes a plurality of bit cells arranged in a plurality of rows and columns. Each of the plurality of rows is associated with at least one word line, and each of the plurality of columns is associated with at least one bit line. A first bit cell is disposed in a first row and a first column. The first bit cell includes a write port and a read port. The write port includes a first set of devices having a first threshold voltage and a second set of devices having a second threshold voltage that is greater than the first threshold voltage. The read port includes a third set of devices having a third threshold voltage that is less than the first threshold voltage.

Figure 1:
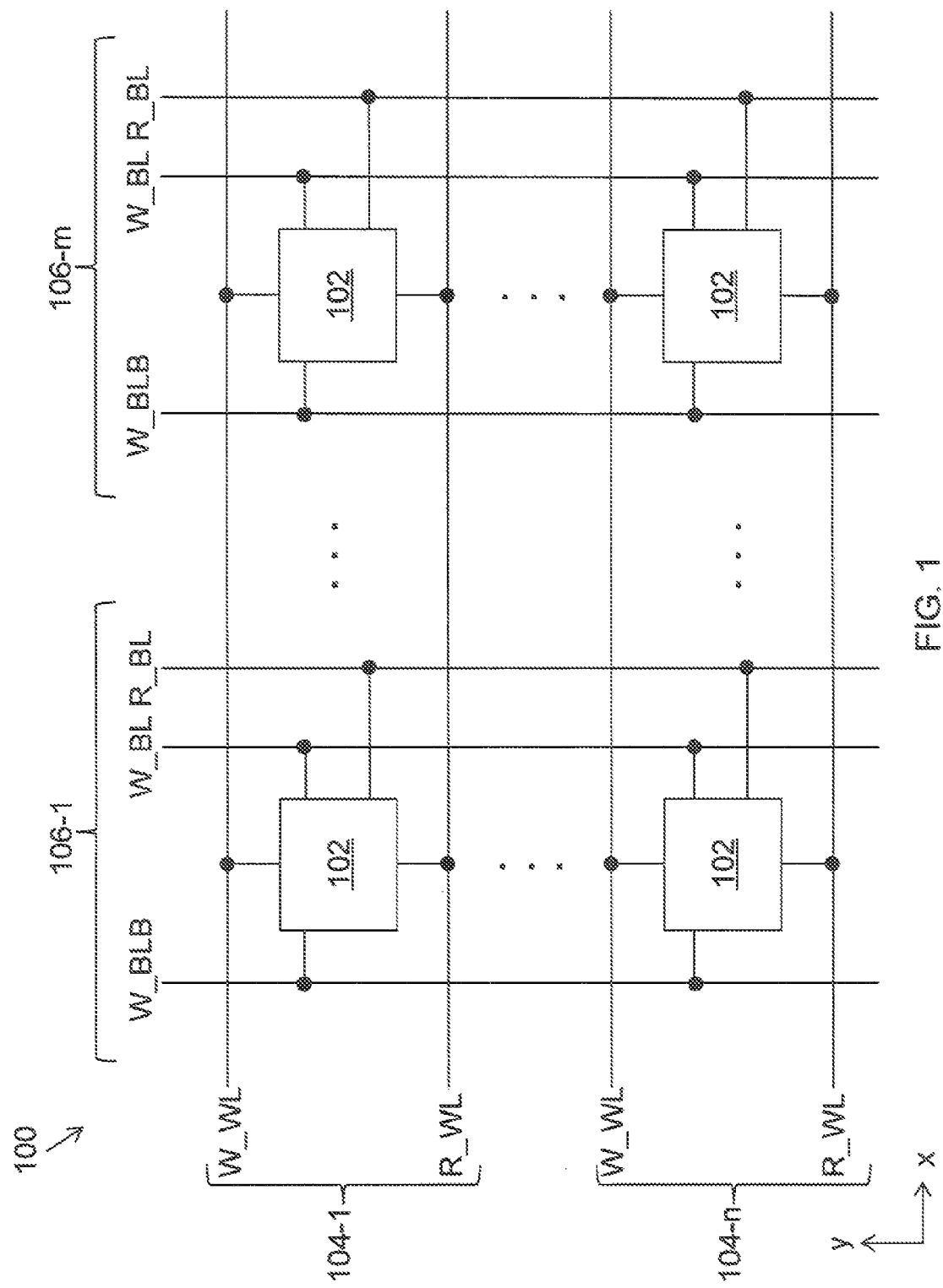
FIG. 1 illustrates one example of an improved semiconductor memory.

FIG. 1 illustrates one example of an improved two-port static random access memory ("SRAM") array 100 including a plurality of bit cells 102. Bit cells 102 are arranged in a number, n, of rows 104 and a number, m, of columns 106. Each bit cell 102 is coupled to a write word line, W_WL, and a read word line, R_WL, that extend horizontally across the memory array (i.e., in an x-direction), to a pair of complementary write bit lines, W_BL, W_BLB, and to a read bit line R_BL. Each of the bit lines, W_BL, W_BLB, and R_BL, extend vertically across the memory array (i.e., in a y-direction).

Figure 2:
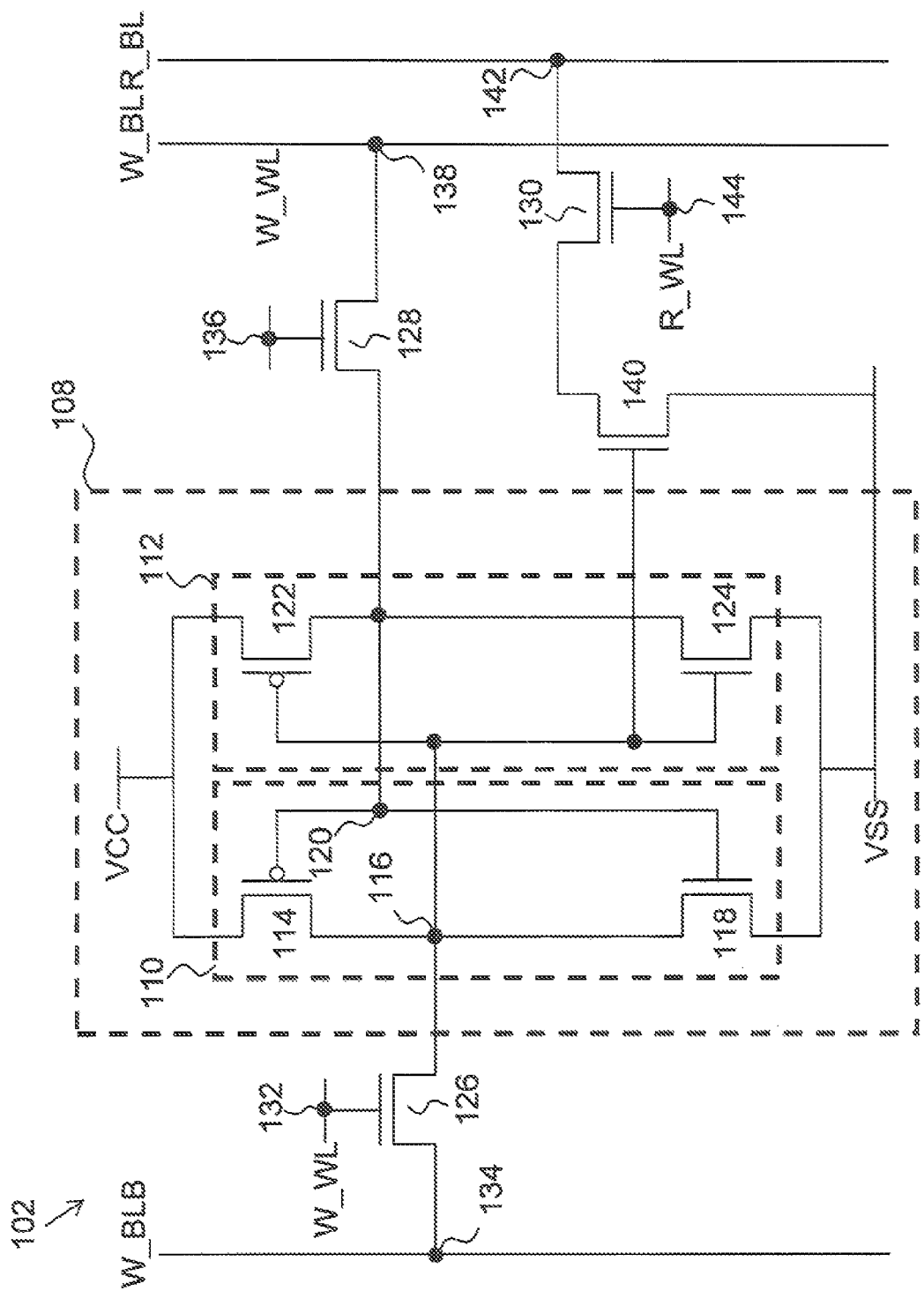
FIG. 2 illustrates one example of an improved memory bit cell in accordance with the semiconductor memory illustrated in FIG. 1.

As best seen in FIG. 2, which is one example of an eight transistor ("8T") bit cell, each bit cell includes a latch 108 formed by a pair of cross coupled inverters 110, 112. Although an 8T bit cell is illustrated, one skilled in the art will understand that bit cell 102 may include other numbers of transistors including, but not limited to, 6T, 10T, 12T, and 14T, to name a few possibilities. Inverter 110 includes a PMOS transistor 114 having its source coupled to high-voltage source, VCC, and its drain coupled to node 116, which serves as the output of inverter 110. NMOS transistor 118 of inverter 110 has its source coupled to low-voltage source VSS and its drain coupled to node 116. The gates of transistors 114 and 118 are coupled together at node 120, which serves as the input of inverter 110 and the output of inverter 112. Inverter 112 includes a PMOS transistor 122 having is source coupled to VCC, its gate coupled to node 116, and its drain coupled to node 120. NMOS transistor 124 of inverter 112 has its source coupled to VSS, its drain coupled to node 120, and its gate coupled to node 116.

Bit cell 102 also includes a plurality of pass transistors 126, 128, and 130. In some embodiments, transistors 126, 128, and 130 are NMOS transistors, although one skilled in the art will understand that transistors 126, 128, and 130 may be implemented as PMOS transistors. Transistor 126 has its gate coupled to write word line W_WL at node 132, its source coupled to node 116, and its drain coupled to write bit line W_BLB at node 134. Transistor 128 has its gate coupled to write word line W_WL at node 136, its source coupled to node 120, and its drain coupled to write bit line W_BL at node 138. Transistor 130 has its source coupled to pull down transistor 140, its drain coupled to read bit line R_BL at node 142, and its gate coupled to read word line R_WL at node 144. Transistor 140 has its source coupled to VSS, its drain coupled to pass transistor 130, and its gate coupled to node 116.

The transistors of bit cell 102 are formed by a process to optimize high speed operation as well as lower leakage. For example, the threshold voltages of transistors 118 and 126 are less than the threshold voltages of transistors 124 and 128, but are higher than the threshold voltages of transistors 130 and 140. Fabricating bit cell 102 such that the transistors have three different threshold voltages advantageously reduces leakage while providing higher operating speeds as described below. In particular, the devices that form the write port of the bit cell are implemented with higher threshold voltages than the read port to provide improved cell stability. The lower threshold voltages in the devices that form the read port advantageously provide higher drive current for improved read speed. As will be understood by one skilled in the art, the transistors of bit cell 102 may be MOSFETS, FinFETs, silicon-on-insulator ("SOI") transistors, SOI FinFETs, and combinations thereof.

Figure 3A:
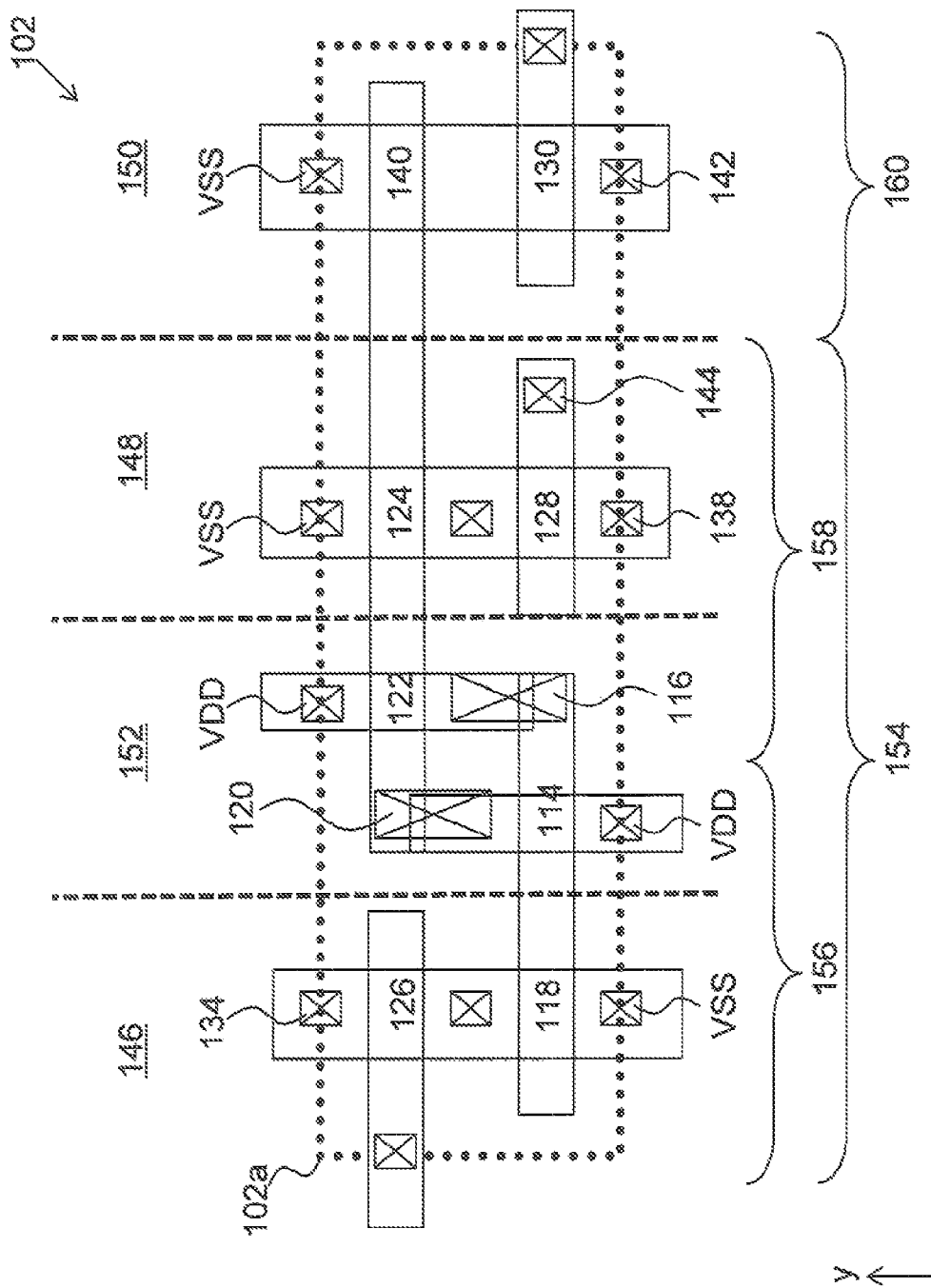
FIG. 3A illustrates one example of a layout of a single improved memory bit cell illustrated in FIG. 2.

FIG. 3A is one example of an improved layout of a single bit cell 102. The periphery 102a of bit cell 102 is shown as a dotted line that extends across three p-wells 146, 148, and 150 and an n-well 152. P-wells 146 and 148 and n-well 152 define a write port area 154 having a first half 156 and a second half 158. As described above, the devices in the first half 156 of write port area 154, e.g., NMOSFET transistors 118 and 126, have a first threshold voltage level that is less than the devices formed in the second half 158 of write port area 154, e.g., NMOSFET transistors 124 and 128. P-well 150 defines a read port area 160 in which pass transistor 130 and pull down transistor 140 are formed such that their respective threshold voltages are less than the threshold voltages of the transistors formed in write port area 154.

In some embodiments, the different threshold voltages are created by providing the devices in second half 158 of write port 154 with gate lengths that are longer than the lengths of the gates of the devices in the first half 156 of write port 154, which are longer than the lengths of the gates of the devices in read port 160. In 32 nm and 28 nm technologies, for example, the gate lengths of transistors is typically between 30 nm and 40 nm. Forming transistor 118 with a gate length of 35±2 nm, transistor 124 with a gate length of 40±2 nm, and transistor 140 with a gate length of 30±2 nm will provide different threshold voltages for transistors 118, 124, and 140. As will be understood by one skilled in the art, a longer gate length of the transistors results in a higher threshold voltage. Accordingly, forming devices in the second half 158 of write port area 154 with the longest gate lengths will provide for the devices to have the highest threshold voltage, forming devices in the first half 156 of write port area 154 with the second longest gate lengths will provide for the devices to have the second highest threshold voltage, and forming devices in the read port 160 with the shortest gate lengths will provide for the devices to have the lowest threshold voltage. The difference in gate lengths between the devices in the second half 158 of write port area 154 and the devices in the first half 156 of write port area 154 may be greater than or equal to five percent of the dimension of the devices in the first half 156 of the write port area 154.

In some embodiments, the different threshold voltages by varying the well and channel doping and/or gate dielectric thickness. For example, p-wells 146 and 148 may be formed by the same well and channel doping process and include devices formed with a first gate oxide thickness, and p-well 150 may be formed by a different well and channel doping process than the well and channel doping process used to form p-wells 146 and 148 and include devices formed with the same gate dielectric thickness as the first gate dielectric thickness.

For example, p-wells 146 and 148 may be formed by a well and channel doping process used to form the core logic of the semiconductor memory 100, i.e., thin gate oxide, and the well and channel doping process used to form p-well 150 is a well and channel doping process used to form input and output ("I/O") logic, i.e., a thick gate oxide, as will be understood by one skilled in the art. In some embodiments, each of p-wells 146, 148, and 150 are formed by the same well and channel doping process and the different threshold voltages of the devices of bit cell 102 are created by adjusting the gate and/or gate dielectric dimensions.

Although only two different processes are used to form p-wells 146, 148 and p-well 150 and their associated devices (i.e., transistors 118, 124, 126, 128, 130, and 140), the devices in the first and second halves 156, 158 of write port 154 and in read port area 160 have different threshold voltages due to the well proximity effect ("WPE"). As described in "Implications of Proximity Effects for Analog Devices" by Drennen et al., the entirety of which is herein incorporated by reference, atoms laterally scatter during the implant process and become concentrated at the edge of a well to create non-uniformities that affect the electrical characteristics of the well. P-well 148 is more affected by the WPE than p-well 146 is affected, and the greater WPE provides for devices with higher threshold voltages. Accordingly, the n-type devices in the second half 158 of write port 154 will have higher threshold voltages than the n-type devices in the first half 156 of write port 154.

In some embodiments, wells 146 and 148 (and p-wells for core devices) may include a first well region that is between 3,000 Å and 6,000 Å from the surface of the semiconductor substrate, a second well region that is between 700 Å and 3,000 Å from the surface of the semiconductor substrate, and a channel region that is between 50 Å and 700 Å from the surface. The first channel region may be doped with $B_{11}$ with an energy between 90 keV and 180 keV to provide a concentration between $5 \times 10^{12}$ cm$^{-3}$ and $3 \times 10^{13}$ cm$^{-3}$, the second channel may be doped with $B_{11}$ with an energy between 50 keV and 90 keV to provide a concentration between $1 \times 10^{13}$ cm$^{-3}$ and $5 \times 10^{13}$ cm$^{-3}$, and the channel region may be doped with $BF_2$ with an energy between 10 keV and 50 keV to provide a concentration between $2 \times 10^{12}$ cm$^{-3}$ and $2 \times 10^{13}$ cm$^{-3}$. The channel region may alternately be doped with $B_{11}$ with an energy between 2 keV and 10 keV to produce a concentration between $2 \times 10^{12}$ cm$^{-3}$ and $2 \times 10^{13}$ cm$^{-3}$.

Well 152 (and the n-wells for core devices) may also include three doping regions: a first doping region between 3,000 Å and 6,000 Å from the surface of the semiconductor substrate, a second well region that is between 700 Å and 3,000 Å from the surface of the semiconductor substrate, and a channel region that is between 50 Å and 700 Å from the surface. The first region of well 152 may be doped with phosphorus with an energy between 220 keV and 400 keV to produce a concentration between $5 \times 10^{12}$ cm$^{-3}$ and $3 \times 10^{13}$ cm$^{-3}$, the second channel region may be doped with phosphorus with an energy between 120 keV and 220 keV to produce a concentration between $5 \times 10^{12}$ cm$^{-3}$ and $5 \times 10^{13}$ cm$^{-3}$, and the channel region may be doped with arsenic with an energy between 40 keV and 120 keV to produce a concentration between $2 \times 10^{12}$ cm$^{-3}$ and $2 \times 10^{13}$ cm$^{-3}$.

Well 150 (and the p-wells for I/O devices) may be formed using three different doping processes like wells 146, 148, and 152 described above. The approximate depths of each of the well regions of well 150 may be the same as those described above with respect to wells 146, 148, and 152. The first well region of well 150 may be doped with The first channel region may be doped with $B_{11}$ with an energy between 90 keV and 180 keV to provide a concentration between $5 \times 10^{12}$ cm$^{-3}$ and $3 \times 10^{13}$ cm$^{-3}$, the second channel may be doped with $B_{11}$ with an energy between 50 keV and 90 keV to provide a concentration between $1 \times 10^{13}$ cm$^{-3}$ and $5 \times 10^{13}$ cm$^{-3}$, and the channel region may be doped with $BF_2$ with an energy between 10 keV and 50 keV to provide a concentration between $1 \times 10^{12}$ cm$^{-3}$ and $1.5 \times 10^{13}$ cm$^{-3}$.

The n-wells for the I/O devices may include a first region at a depth of approximately 3,000 Å to 6,000 Å from the surface of the semiconductor substrate. The first region may be doped with phosphorus at an energy between 220 keV and 400 keV to produce a concentration between $5 \times 10^{12}$ cm$^{-3}$ and $3 \times 10^{13}$ cm$^{-3}$. A second region is formed at a depth ranging from 700 Å to 3,000 Å by implanting phosphorus with an energy between 120 keV and 220 keV to produce a concentration between $5 \times 10^{12}$ cm$^{-3}$ and $5 \times 10^{13}$ cm$^{-3}$. The channel region of the I/O n-well is formed by implanting arsenic to a depth ranging from 50 Å and 700 Å using an energy between 40 keV and 120 keV. The arsenic is implanted to create a concentration between $1 \times 10^{12}$ cm$^{-3}$ and $1.5 \times 10^{13}$ cm$^{-3}$.

In addition or alternatively to varying the well/channel doping processes of the different wells, the thickness of the gate dielectrics of the devices in the write port area 154 may be formed by a process to provide a first thickness and the devices in the read port area may be formed by a different well-formation process to provide a lower threshold voltage but the same gate dielectrics as the first thickness. For example, in 32 nm or 28 nm technologies, the gate dielectric thickness of SiON of a polysilicon gate may be between 16 Å and 26 Å for core devices and 30 Å to 70 Å for I/O devices. In embodiments in which a metal gate is disposed over a high-k material, the high-k material may be formed such that it has a thickness between 8 Å and 18 Å for core devices and a thickness between 30 Å and 70 Å for I/O devices. In some embodiments of 32 nm and 28 nm technologies, the deposition thickness of SiON over which a polysilicon gate is formed is between 15 Å and 24 Å for core devices and between 28 Å and 70 Å for I/O devices. Examples of deposition thickness for high-k dielectric materials (including an initial oxide) over which metal gates are formed include, but are not limited to, thicknesses between 10 Å and 26 Å for core devices and thicknesses between 30 Å and 70 Å for I/O devices. The ranges provided above are merely examples and are not limiting as other thicknesses, dielectric and gate materials, and technologies may be implemented.

One skilled in the art will understand that there are other ways in which the devices in the first half 156 of write port 154 (i.e., transistors 118 and 126) may be formed such that they have different threshold voltages than the devices in the second half 158 of write port area 154 (i.e., transistors 124 and 128) and in the read port 160 (i.e., transistors 130 and 140). For example, any of the techniques described above may be combined to provide bit cells 102 that include devices having three distinct threshold voltages.

Figure 3B:
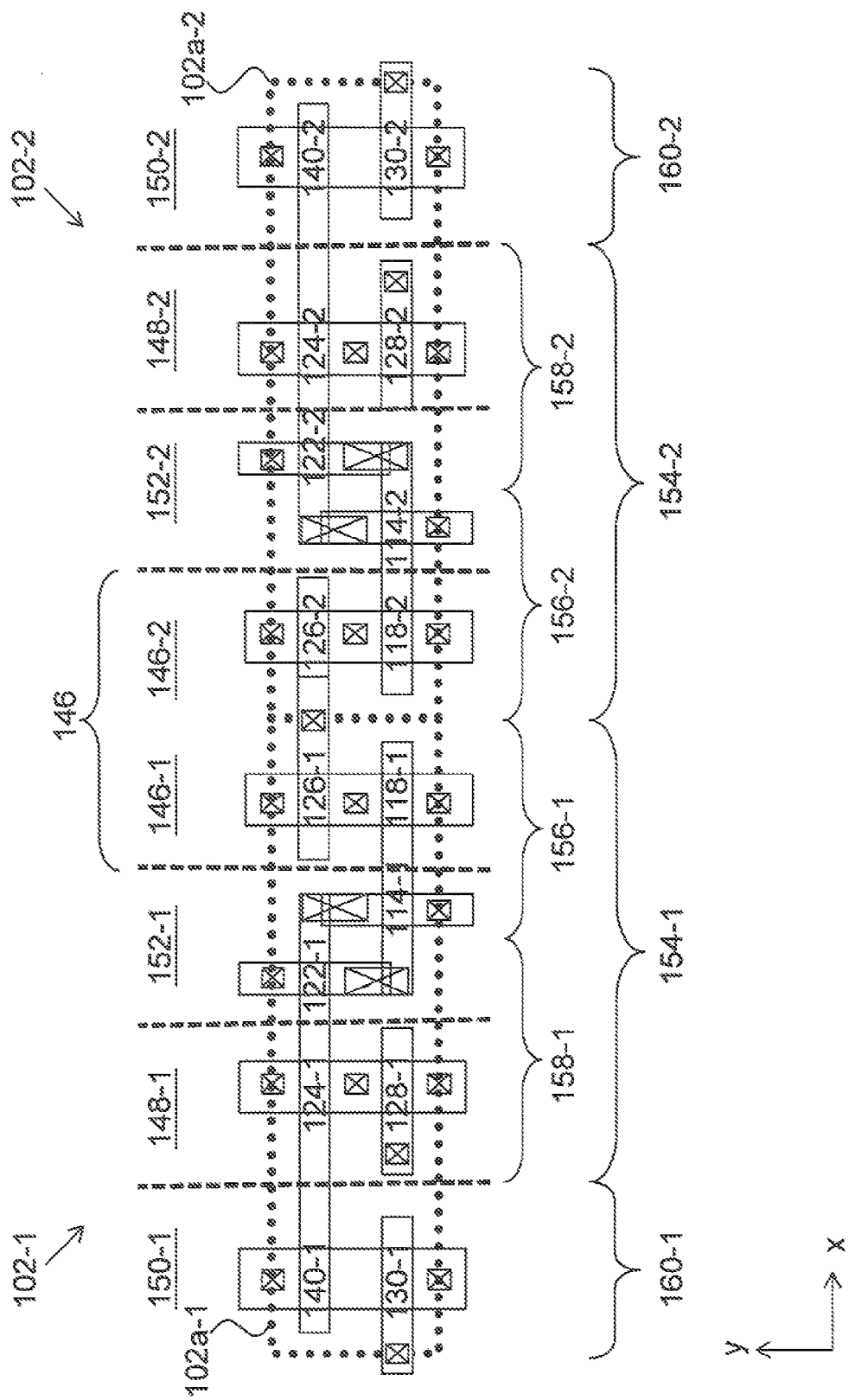
FIG. 3B illustrates one example of a layout of a pair of directly adjacent improved memory bit cells.

The wells of adjacent bit cells 102 may be arranged such that like wells are formed directly adjacent to one another. For example, FIG. 3B illustrates one example of a pair of directly adjacent bit cells 102-1 and 102-2. Although not shown in FIG. 3B, a read port 160 of another bit cell 102 may be disposed directly adjacent to read port 160-1 of bit cell 102-1 such that the p-wells 150 in which the read port devices are formed may be fabricated together.

Bit cell 102-1 is laid out such that its read port 160-1 is formed at the leftmost part of bit cell 102-1 and is disposed adjacent to the second half 158-1 of write port 154-1. The first half 156-1 of write port 154-1 is disposed directly adjacent to the first half 156-2 of write port 154-2 of bit cell 102-2. P-wells 146-1 and 146-2, in which devices 118-1, 118-2, 126-1, and 126-2 are formed, may be formed by the same process such that a single p-well 146 may be fabricated having an area that is twice the area of individual p-wells 146-1 and 146-2.

Bit cell 102-2 is laid out as bit cell 102 illustrated in FIG. 3A. For example, the first half 156-2 of write port area 154-2 is at the left of bit cell 102-2 and the second half 158-2 of write port area 154-2 is disposed directly adjacent the first half 156-2. Read port 160-2 is disposed at the rightmost part of bit cell 102-2. Similar to p-well 150-1 in which read port 160-1 of bit cell 102-1 is formed, p-well 150-2 may be disposed directly adjacent to another p-well 150 of another bit cell 102 (not shown) such that a single p-well 150 having an area that is twice the area of p-well 150-2 can be formed. One skilled in the art will understand that the bit cells 102 of a semiconductor array 100 can be laid out in other ways not expressly disclosed herein.

Figure 4:
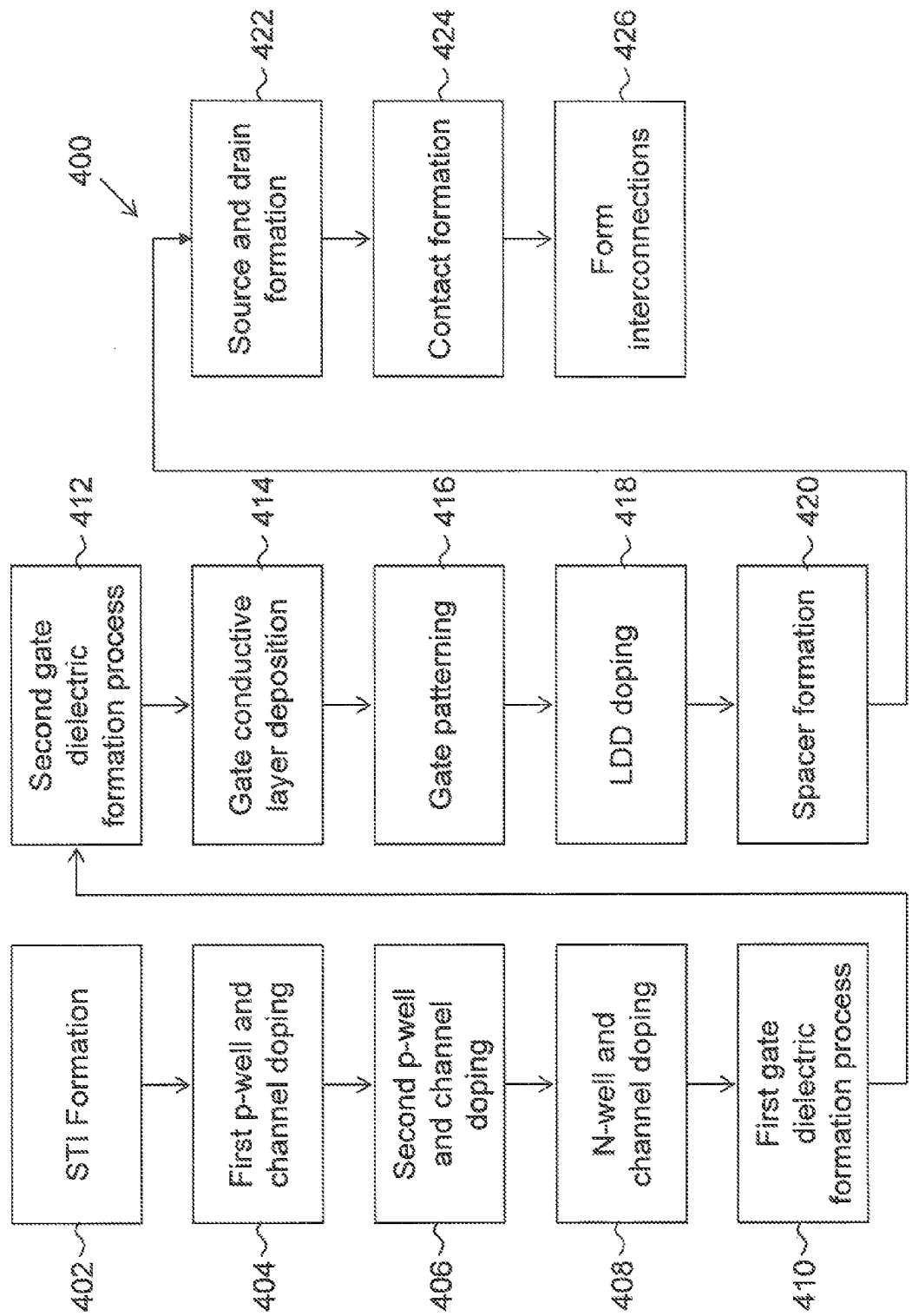
FIG. 4 is a flow diagram of one example of fabricating an improved semiconductor memory.

One example of a method of fabricating a semiconductor memory including improved bit cells is described with reference to FIG. 4. At block 402, shallow trench isolation ("STI") features are formed in a semiconductor substrate. As will be understood by one skilled in the art, forming STI formation may include etching the semiconductor substrate and filling the etched regions (trenches) with a dielectric material such as silicon dioxide. The semiconductor wafer with the trenches filled within the dielectric material may be planarized to remove the excess dielectric.

At block 404, a first well and channel doping process is performed to form p-wells 146 and 148 as well as other core logic for semiconductor memory 100. The first well and channel doping process may include lithography (e.g., photoresist patterning and etching) and doping steps. For example, once the photoresist has been patterned, the semiconductor substrate may be doped with boron, borondifluoride, germanium, indium, carbon, nitrogen, and/or combinations thereof to create p-well 146. The channel for devices 118 and 126 may also be doped at block 404 as will be understood by one skilled in the art.

At block 406, a second well and channel doping process is performed to form p-well 150 as well as the I/O logic for semiconductor memory 100. The second well and channel doping process may include lithography (e.g., photography patterning and etching) and doping steps. The parameters used in the second well and channel doping are different from the parameters used in the first well and channel doping process, but may include doping the semiconductor substrate with boron, borondifluoride, germanium, indium, carbon, nitrogen, and/or combinations thereof. In some embodiments, such as embodiments when the different threshold voltages are provided by different gate lengths and/or oxide thicknesses, block 406 is used to form I/O logic, but not to form p-well 150 as p-well 150 is formed at block 404.

At block 408, a third well and channel doping process is performed to form n-well 152 as well as any core logic and/or I/O logic for semiconductor memory. The process formed at block 408 may include lithography (e.g., photography patterning and etching) and doping steps. The semiconductor substrate may be doped by one or more group V elements including, but not limited to, phosphorus, arsenic, and antimony to create n-well 152.

At block 410, the gate dielectrics are formed for the devices of a first type, e.g., the gates of the I/O devices. As will be understood by one skilled in the art, the gate dielectrics for the I/O logic may be formed depositing silicon dioxide, silicon oxynitride, nitrided silicon dioxide, metal oxide (such as, for example, Hf oxide, AL oxide, Ta oxide, and others), or other dielectric materials over the channel area of the devices. Such dielectric materials may be deposited by a variety of methods including, but not limited to, physical vapor deposition, chemical vapor deposition, thermal oxidation in an oxygen ambient, or thermal oxidation in a nitrogen ambient, to name a few possible methods. In some embodiments, the excess gate dielectric material may be removed by a wet or dry etching process.

At block 412, the gate dielectrics are formed for the devices of a second type, e.g., the gates of the core devices. The gate dielectrics for the core devices are formed such that they have a thickness that is thinner than the thickness of the gate dielectric of the I/O logic devices. As described above with respect to block 410, examples of the gate dielectric materials include, but are not limited to, silicon dioxide, silicon oxynitride, nitrided silicon dioxide, metal oxide (such as, for example, Hf oxide, AL oxide, Ta oxide, and others), or other dielectric materials. The gate dielectric materials may be formed over the channel areas by physical vapor deposition, chemical vapor deposition, thermal oxidation in an oxygen ambient, or thermal oxidation in a nitrogen ambient, or other deposition methods.

At block 414, a conductive material is formed over the gate dielectric material. Examples of the conductive material include, but are not limited to, polysilicon, doped polysilicon, aluminum, copper, tungsten, tantalum, titanium, and refractory metals such as TiN, TaN, TiW, TiAl, and/or combinations thereof.

At block 416, the conductive materials are patterned to form the gate electrodes at block 416. In some embodiments, the conductive material may be patterned to provide different gate lengths for the devices in the first half 156 of write port 154, in the second half 158 of write port 154, and in the read port 160. In some embodiments, the conductive material is patterned to provide gates having a longer length in the second half 158 of write port 154 than a length of the gates in the first half 156 of write port 154.

At block 418, a doping process to provide lightly-doped drains ("LDD") in one or more types of devices. For example, the devices of the I/O logic may be provided with an LDD and/or the devices of the core logic may be provided with an LDD. In some embodiments, the devices of the second half 158 of write port 154 have their drains doped to increase their threshold voltages and the devices of the first half 156 of write port 154 do not have their doped such that they have a lower threshold voltage than the threshold voltages of the devices in the second half 158 of write port 154.

At block 420, spacers are formed over the semiconductor substrate. As will be understood by one skilled in the art, spacers may be formed on the gate electrode using a hard-mask material such as, for example, silicon oxide.

At block 422, the sources and drains of the devices are formed. The sources and drains may be formed by ion implantation in the semiconductor substrate.

At block 424, conductive contacts are formed. The contacts may be formed by etching holes in a dielectric material formed over the source and drain regions of the devices and filling the holes with a conductive material. Examples of conductive materials that may be used as a conductive contact include, but are not limited to, aluminum, a refractory metal such as tungsten, a silicide, and/or combinations thereof.

At block 426, the interconnections and routing layers are formed. The interconnections are formed by metallization steps in which conductive and dielectric layers are formed over the semiconductor substrate. The conductive material may include aluminum and/or tungsten, for example, that is deposited by evaporation or sputtering. Wet and dry etching steps may be performed to removed unwanted conductive materials.

One skilled in the art will understand that the order in which the steps of method 400 are performed may be varied. For example, the second gate dielectric formation process of block 412 may be performed after the source and drains are performed at block 422. In some embodiments, both the first dielectric formation process of block 410 and the second dielectric formation process of block 412 may be performed after forming the sources and drains at block 422. Other variations in the order in which method 400 is performed are possible.

The improved semiconductor memories described above advantageously provide higher operating speeds with lower leakage without requiring additional footprint on the semiconductor substrate. In particular, the devices that form the write port of the bit cell are implemented with higher threshold voltages than the read port to provide improved cell stability. The lower threshold voltages in the devices that form the read port advantageously provide higher drive current for improved read speed.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A memory bit cell, comprising:
    a latch;
    a write port coupled to the latch, including a first set of devices having a first threshold voltage, and a second set of devices having a second threshold voltage that is greater than the first threshold voltage; and
    a read port coupled to the latch, including a third set of devices having a third threshold voltage that is less than the first threshold voltage,
    wherein the first set of devices are formed in a first well of a first type, the second set of devices are formed in a second well of the first type, and the third set of devices are formed in a third well of the first type, and a fourth set of devices are formed in a first well of a second type.

2. The memory bit cell of claim 1, wherein the first set of devices have a first gate length, the second set of devices have a second gate length that is longer than the first gate length, and the third set of devices have a third length that is shorter than the first gate length.

3. The memory bit cell of claim 1, wherein the first well of the first type has a first doping concentration, the second well of the first type has a second doping concentration that is different than the first doping concentration, and the third well of the first type has a third doping concentration that is different than the first and second doping concentrations.

4. The memory bit cell of claim 1, wherein the first well of the first type is disposed directly adjacent to the first well of the second type, and the second well of the first type is disposed between the first well of the second type and the third well of the first type.

5. The memory bit cell of claim 1, wherein a gate dielectric thickness of the first, second, and third sets of devices is the same.

6. The memory bit cell of claim 5, wherein the first and second wells of the first type have a first doping concentration, and the third well of the first type has a second doping concentration that is different than the first doping concentration.

7. The memory bit cell of claim 1, wherein a gate dielectric thickness of the first, second, and third sets of devices is the same, and a gate dielectric thickness of the fourth set of devices is different than the gate dielectric thickness of the first, second, and third sets of devices.

8. A method of fabricating a semiconductor memory, comprising:
- forming a first set of devices of a memory bit cell in a semiconductor substrate, the first set of devices having a first threshold voltage;
- forming a second set of devices of the memory bit cell in the semiconductor substrate, the second set of devices having a second threshold voltage that is greater than the first threshold voltage;
- forming a third set of devices of the memory bit cell in the semiconductor substrate, the third set of devices having a third threshold voltage that is less than the first threshold voltage; and
- forming a fourth set of devices of the memory bit cell in the semiconductor substrate, the fourth set of devices having a fourth threshold voltage,
- wherein
  - forming the first set of devices includes doping the semiconductor substrate to create a first well of a first type,
  - forming the second set of devices includes doping the semiconductor substrate to create a second well of the first type,
  - forming the third set of devices includes doping the semiconductor substrate to create a third well of the first type, and
  - forming the fourth set of devices includes doping the semiconductor substrate to create a first well of a second type.

9. The method of claim 8, wherein
- forming the first, second, and third sets of devices respectively includes depositing a gate dielectric of a first thickness over the first, second, and third wells of the first type; and
- forming the fourth set of devices includes depositing a gate dielectric of a second thickness that is different than the first thickness.

10. The method of claim 8, wherein
- forming the first set of devices includes patterning a conductive material disposed over the semiconductor substrate to provide gate electrodes having a first length;
- forming the second set of devices includes patterning the conductive material to provide gate electrodes having a second length that is greater than the first length; and
- forming the third set of devices includes patterning the conductive material to provide gate electrodes having a third length that is less than the first length.

11. The method of claim 8, wherein the first and second sets of devices form a write port and the third set of devices form a read port.

12. A semiconductor memory, comprising:
- a plurality of bit cells arranged in a plurality of rows and columns, each of the plurality of rows associated with at least one word line, and each of the plurality of columns associated with at least one bit line,
- wherein a first bit cell is disposed in a first row and a first column and includes:
  - a write port including a first set of devices having a first threshold voltage, and a second set of devices having a second threshold voltage that is greater than the first threshold voltage; and
  - a read port including a third set of devices having a third threshold voltage that is less than the first threshold voltage,
- wherein the first set of devices are formed in a first well of a first type, the second set of devices are formed in a second well of the first type, the third set of devices are formed in a third well of the first type, and a fourth set of devices are formed in a first well of a second type.

13. The semiconductor memory of claim 12, wherein the first well of the first type is disposed directly adjacent to the first well of the second type, and the second well of the first type is disposed between the first well of the second type and the third well of the first type.

14. The semiconductor memory of claim 13, wherein a second bit cell is disposed in the first row and a second column, the second bit cell including:
- a write port including a fifth set of devices having the first threshold voltage and a sixth set of devices having the second threshold, the fifth set of devices formed in a fourth well of the first type, the sixth set of devices formed in a fifth well of the first type, and a seventh set of devices formed in a second well of the second type; and
- a read port including an eighth set of devices having the third threshold voltage, the eighth set of devices formed in a sixth well of the first type.

15. The semiconductor memory of claim 14, wherein
- the fourth well of the first type is disposed directly adjacent to the second well of the second type and to the first well of the first type,
- the fifth well of the first type is disposed between the second well of the second type and the sixth well of the first type.

16. The semiconductor memory of claim 14, wherein
- the fourth well of the first type is disposed directly adjacent to the second well of the second type,
- the fifth well of the first type is disposed between the second well of the second type and the sixth well of the first type, and
- the sixth well of the first type is disposed directly adjacent to the third well of the first type.

17. The semiconductor memory of claim 12, wherein the first set of devices have a first gate length, the second set of devices having a second gate length that is longer than the first gate length, and the third set of devices have a third length that is shorter than the first gate length.

* * * * *